(12) United States Patent
Finsterbusch et al.

(10) Patent No.: US 6,603,830 B1
(45) Date of Patent: Aug. 5, 2003

(54) SYNCHRONIZATION METHOD FOR A RECEIVING UNIT AND A RECEIVING UNIT CORRESPONDING THERETO

(75) Inventors: Rolf Finsterbusch, Chemnitz (DE); Steffen Hellmich, Chemnitz (DE); Marco Seja, Seifersbach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/504,290

(22) Filed: Feb. 15, 2000

(30) Foreign Application Priority Data

Feb. 15, 1999 (DE) .......................................... 199 06 297
Jul. 13, 1999 (DE) .......................................... 199 32 635

(51) Int. Cl.$^7$ ................................................ H04L 7/04
(52) U.S. Cl. ..................... 375/362; 375/355; 375/354; 375/373; 375/376; 327/156; 327/159

(58) Field of Search ................................. 375/354–376; 327/156, 159

(56) References Cited

U.S. PATENT DOCUMENTS

| | | | | |
|---|---|---|---|---|
| 3,619,505 A | * | 11/1971 | Meile .......................... | 375/359 |
| 4,805,197 A | * | 2/1989 | Van Der Jagt et al. ..... | 375/361 |
| 6,163,185 A | * | 12/2000 | Deluigi et al. .............. | 327/156 |
| 6,304,623 B1 | * | 10/2001 | Richards et al. ............ | 375/355 |

\* cited by examiner

*Primary Examiner*—Don N. Vo
*Assistant Examiner*—Qutub Ghulamali
(74) *Attorney, Agent, or Firm*—Staas & Halsey LLP

(57) ABSTRACT

A receiving unit is more precisely synchronized to a transmitting unit by transmitting synchronization signals from the transmitting unit, adjusting a clock-pulse generator of a phase-locked loop, a phase shifter integrating instantaneous phase errors to an integration value, and adjusting the integration value to an integration fraction that is less than one.

12 Claims, 2 Drawing Sheets

SYNCHRONIZATION METHOD FOR A RECEIVING UNIT AND A RECEIVING UNIT CORRESPONDING THERETO

FIELD OF THE INVENTION

The present invention relates to a synchronization method for a receiving unit and a receiving unit corresponding to the synchronization method. Cyclically emitted synchronization signals are transmitted to the receiving unit from a transmitting unit. The receiving unit feeds the synchronization signals to a phase shifter of a phase-locked loop that has a clock-pulse generator. The clock-pulse generator emits a number of clock signals between two synchronization signals. The phase shifter, upon reception of the synchronization signals, detects instantaneous phase errors and readjusts the clock-pulse generator so that the clock-pulse generator emits a desired number of clock signals between two synchronization signals.

BACKGROUND INFORMATION

Conventional synchronization methods of this type and corresponding receiving units are used, inter alia, in field bus systems, e.g., the PROFIBUS.

Field bus systems are distributed control systems, which as a rule have one transmitting unit (top-assembly group, bus master) and a multiplicity of receiving units (slaves). The individual slave assemblies, as a rule, are driven as a result of the transmitting unit transmitting a command telegram to the receiving units. Upon receiving the command telegram, the receiving units output setpoint values to a controlled technical system, the setpoint values having been transmitted previously to them by the transmitting unit. At the same time, the receiving units read in the actual values from the controlled technical system, which they subsequently transmit to the transmitting unit. The transmitting unit then calculates new setpoint values, which it transmits to the individual receiving units, so that they are ready for the next command telegram.

The command telegrams are transmitted from the transmitting unit so as to be equidistant in time. Therefore, from the command telegrams, it is possible to derive synchronization signals, which are used to synchronize the receiving units to the transmitting unit.

In practice, between the transmission of the read-in actual values to the transmitting unit and the transmission of the setpoint values to the receiving units, and the transmission of the next command telegram, there remains a quantity of free time. The latter, as a rule, is used for so-called acyclical telegrams. In this context, due to the delays caused by the acyclical telegrams, individual command telegrams may be delayed in being transmitted. The reception of command telegrams that have been delayed in their transmission causes a defective post-synchronization of the receiving units. In many applications, this defective post-synchronization is not critical. However, in time-critical applications, in particular in the case of the clutch of interpolating drive axles, a defective post-synchronization of this type cannot be tolerated.

SUMMARY OF THE INVENTION

An objective of the present invention is to create a synchronization method for a receiving unit, by which the receiving unit may be precisely synchronized to the transmitting unit.

The objective is achieved by the fact that the phase shifter integrates the instantaneous phase errors into an integration value and the integration value is adjusted to an integration fraction, which is smaller than one.

If the phase shifter adjusts the instantaneous phase errors to a proportional fraction, which is smaller than one, the result is a more rapid adjustment of the phase error. This is especially true when the proportional fraction is larger than the integration fraction.

If the phase shifter adjusts the clock-pulse generator only when the absolute value of the instantaneous phase error does not exceed a maximal error, then delays of the synchronization signals caused by acyclical telegrams do not result in any defective readjustment of the clock-pulse generator.

If, when the maximal error is exceeded, a counter is counted up (increased), then, in particular, a long-lasting error in the communication between the transmitting unit in the receiving unit can be recognized.

If a validity signal is transmitted to the phase-locked loop by a control unit and the synchronization method is carried out only if the validity signal is present, then it can be ensured that the synchronization results from the correct synchronization signals.

If, within the clock-pulse generator, a clock generator generates primary clock signals that are fed to a frequency divider, which outputs the divided primary clock signals as clock signals on the output side, it is assured that all of the components arranged between the clock generator and the frequency divider are also synchronized in phase.

If, before the detection of the first instantaneous phase error, the clock-pulse generator outputs the desired number of clock signals, the process is thereupon stopped, and it is started once again upon reception of the next synchronization signal, then there results a particularly rapid synchronization of the receiving unit during start-up.

If, upon reception of the first synchronization signal after the re-start-up of the clock-pulse generator, the instantaneous phase error is at least substantially corrected and the integration of the instantaneous phase errors and the correction of the integration value, possibly including the correction of the instantaneous phase error, are carried out only upon reception of the second synchronization signal, then the synchronization is further accelerated at the beginning of the process.

DETAILED DESCRIPTION

Figure 1:
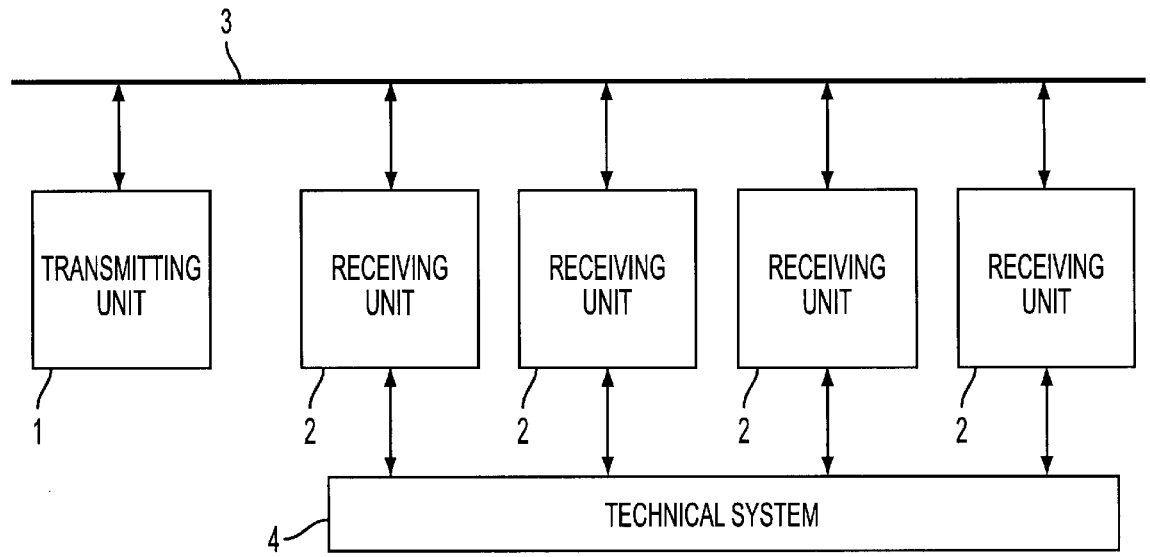
FIG. 1 shows a distributed control system.

According to FIG. 1, a distributed control system has a transmitting unit 1 and receiving units 2, which are connected to each other by a bus system 3. Transmitting unit 1 cyclically transmits telegrams to receiving units 2, which react to the received telegrams appropriately. For example, receiving units 2 read in input quantities from a controlled technical system 4 and read out output quantities to technical system 4. This is indicated in FIG. 1 by the arrows between receiving units 2 and technical system 4.

The communication between transmitting unit 1 and receiving units 2 takes place, as a rule, in accordance with the following cyclically structured schematic: first, transmitting unit 1 transmits to receiving units 2 output quantities, which are to be outputted to technical system 4. Then it transmits a command telegram to receiving units 2. Upon transmission of the command telegram, receiving units 2 read out output quantities to technical system 4 and read in input quantities from technical system 4. Thereupon, the read-in input quantities are extracted from transmitting unit 1.

In an advantageous embodiment, the above schematic is executed in a strictly cyclical manner and so as to be strictly equidistant in time. In particular, the command telegrams therefore may be used as synchronization signals S, or synchronization signals S may be derived from the command telegrams. Using synchronization signals S, receiving units 2 may then be synchronized to transmitting unit 1.

Figure 2:
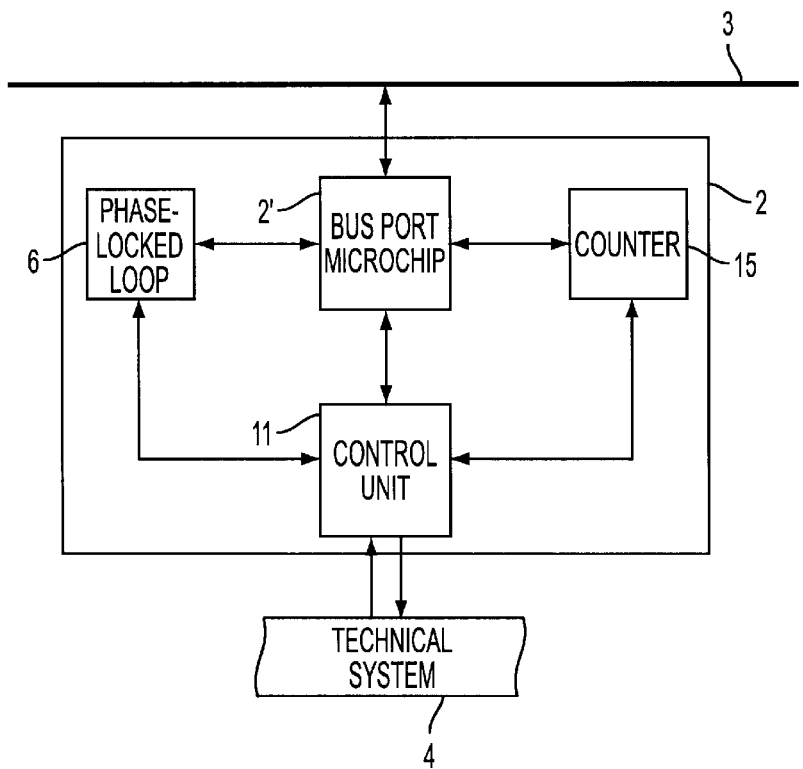
FIG. 2 shows a receiving unit.
Figure 3:
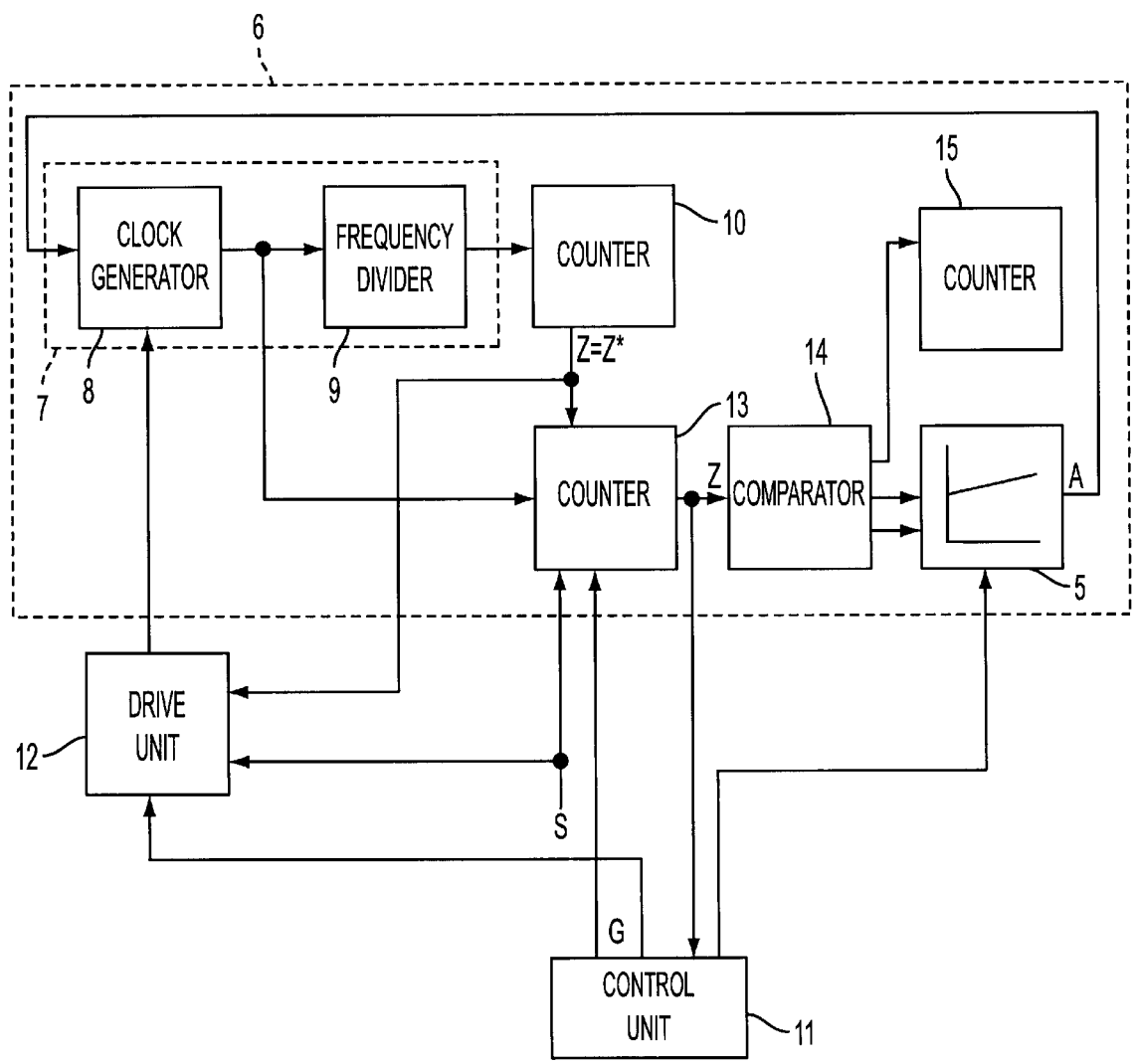
FIG. 3 shows a phase-locked loop.

The synchronization signals received from receiving units 2, according to FIGS. 2 and 3, are fed via a bus port module 2' to a phase shifter 5 of a phase-locked loop 6. Phase-locked loop 6 has a clock-pulse generator 7. Within clock-pulse generator 7, a clock generator 8 generates primary clock signals, which are fed to a frequency divider 9. On the output side, frequency divider 9 outputs the divided-down primary clock signals as clock signals. The clock signals are fed to a clock signal counter 10.

In one embodiment, the closed-loop control of clock generator 8, clock-pulse generator 7, between two synchronization signals S, generates precisely a desired number Z* of clock signals. As a rule, however, clock-pulse generator 7 generates a number Z of clock signals, which deviates from desired number Z*. Phase shifter 5 therefore determines the instantaneous phase errors z upon reception of the synchronization signals and then adjusts clock-pulse generator 7 such that it outputs desired number Z* of clock signals between two synchronization signals S. This happens as follows:

Before the beginning of the synchronization, thus before first instantaneous phase error z is detected, a start signal is input initially by a control unit 11 of a drive unit 12. This drive unit thereupon drives clock generator 8 of clock-pulse generator 7. When clock signal counter 10 has counted desired number Z* of clock signals, clock signal counter 10 transmits a signal to drive unit 12. The latter thereupon once again stops clock generator 8. Phase-locked loop 6, as a result, is "prestressed," in a manner of speaking. Upon reception of the next synchronization signal, which is also transmitted to drive unit 12, the latter then once again starts clock generator 8. As a result, clock signal counter 10 is once again counted up (increased).

The reaching of desired number Z* as well as the arrival of next synchronization signal S are reported to a primary clock counter 13. Upon the arrival of the first of these two signals, primary clock counter 13 is started, and upon the arrival of the second of the two signals, it is stopped. The (sign-bearing) counter reading of primary clock counter 13, therefore, is a direct measure for an error between the clocking of clock-pulse generator 7 and the periodicity of synchronization signals S.

Upon reception of first synchronization signal S after the restart-up of clock-pulse generator 7, the counter reading of primary clock counter 13 is transmitted to control unit 11. The latter calculates from the counter reading a compensation value for the driving of clock-pulse generator 8 and provides this compensation value directly to phase shifter 5. As a result, instantaneous phase errors z detected at the first synchronization cycle are at least substantially corrected.

In further synchronization cycles, primary clock counter 13 is always controlled as a function of synchronization signal S and reaching desired value Z*. Upon the arrival of the first of these two signals, primary clock counter 13 is started, and upon the arrival of the second of these two signals, it is stopped. The counter reading of primary clock counter 13 is fed to a comparator 14. The counter reading of primary clock counter 13 is compared with a maximal error. If the counter reading exceeds the maximal error, an off-time counter 15 is counted up (increased). In this case, no error signal is sent to phase shifter 5. Phase shifter 5 retains its previous output signal.

Otherwise, the output signal A of phase shifter 5 is calculated according to the following formula:

$$I(i)=I(i-1)+ki\cdot z(i)$$
$$A(i)=kp\cdot z(i)+I(i)$$

In this context, z(i) is the instantaneous phase error, kp is the proportional fraction, to which instantaneous phase error z(i) is adjusted, I(i) is the integration value, to which instantaneous phase errors z(k), k=0,1,2,3 . . . I were integrated, and ki is the integration fraction, to which integration value I is adjusted.

In practice, the following values may be beneficial: integration fraction ki typically should be between 0.01 and 0.04, i.e., less than 1. Proportional fraction kp should also be smaller than 1, but larger than integration fraction ki. Typically, proportional fraction kp is between 0.04 and 0.10.

As a rule, primary clock counter 13 is started or stopped in response to each transmission of a synchronization signal S. However, it is also possible to transmit a validity signal G from control unit 11 to phase-locked loop 6. In this case, primary clock counter 13 is only started and stopped if validity signal G is present. In addition, it is possible to start and evaluate primary clock counter 13 shifted by one phase shift with respect to synchronization signal S.

Using the method according to the present invention, it is also possible, in particular, to precisely drive interpolating axles that are controlled in a distributed manner.

What is claimed is:

1. A synchronization method for a receiving unit, comprising the steps of:

cyclically transmitting synchronization signals to the receiving unit from a transmitting unit;

feeding the synchronization signals from the receiving unit to a phase shifter of a phase-locked loop having a clock-pulse generator;

emitting a number of clock signals between two synchronization signals, the clock pulse generator emitting the number of clock signals; and upon reception of the synchronization signals by the phase shifter, detecting instantaneous phase errors and readjusting the clock-pulse generator so that the clock-pulse generator emits a predetermined number of clock signals between two synchronization signals, the phase shifter integrating the instantaneous phase errors to an integration value, the integration value being adjusted to an integration fraction less than one.

2. The synchronization method according to claim 1, further comprising the step of:

adjusting the instantaneous phase errors to a proportional fraction using the phase shifter, the proportional fraction being less than one.

3. The synchronization method according to claim 2, wherein the proportional fraction is less than the integration fraction.

4. The synchronization method according to claim 1, further comprising the step of:

adjusting the clock-pulse generator only if an absolute value of the instantaneous phase error is less than a maximal error.

5. The synchronization method according to claim 4, further comprising the step of:

increasing a counter if the absolute value of the instantaneous phase error is greater than the maximal error.

6. The synchronization method according to claim 1, further comprising the steps of:

transmitting a validity signal from a control unit to the phase-locked loop; and executing the synchronization method only if the validity signal is present.

7. The synchronization method according to claim 1, further comprising the step of:

generating primary clock signals using a clock generator arranged in the clock-pulse generator, the primary clock signals being fed to a frequency divider, the frequency diver outputting divided primary clock signals as clock signals.

8. The synchronization method according to claim 1, further comprising the steps of:

before the detection of a first instantaneous phase error, outputting from the clock-pulse generator the desired number of clock signals;

stopping the clock-pulse generator after the step of outputting; and restarting the clock-pulse generator upon reception of a next synchronization signal.

9. The synchronization method according to claim 8, further comprising the steps of:

upon restarting the clock-pulse generator, starting the clock-pulse generator only after a phase shift; and detecting the number of clock signals including the phase shift that are outputted by the clock-pulse generator down to the next synchronization signal.

10. The synchronization method according to claim 8, further comprising the steps of:

upon reception of a first synchronization signal after the step of restarting the clock-pulse generator, at least substantially correcting the instantaneous phase error; and executing the integration of the instantaneous phase errors and the adjustment of the integration value only after receiving a second synchronization signal.

11. The synchronization method according to claim 10, further comprising the step of:

executing the step of correcting the instantaneous phase error only after receiving the second synchronization signal.

12. A receiving unit performing a synchronization method, comprising:

a receiver receiving cyclically transmitted synchronization signals from a transmitting unit; and a phase-locked loop having a clock-pulse generator, a phase shifter of the phase-locked loop, the synchronization signals being fed to the phase shifter, the clock-pulse generator emitting a number of clock signals between two synchronization signals, the phase shifter detecting instantaneous errors and readjusting the clock-pulse generator so that the clock pulse generator emits a predetermined number of clock signals between two synchronization signals, the phase shifter integrating the instantaneous phase errors to an integration value, the integration value being adjusted to an integration fraction less than one.

* * * * *